(12) United States Patent
Tanaka

(10) Patent No.: US 6,256,236 B1
(45) Date of Patent: Jul. 3, 2001

(54) SEMICONDUCTOR DEVICE CAPABLE OF IMPLEMENTING SIMULTANEOUS SIGNAL INPUT AND OUTPUT FROM AND TO THE SAME EXTERNAL TERMINAL

(75) Inventor: Shinji Tanaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/620,716

(22) Filed: Jul. 20, 2000

(30) Foreign Application Priority Data

Jan. 31, 2000 (JP) .................................................. 12-022304

(51) Int. Cl.[7] ...................................................... G11C 7/00

(52) U.S. Cl. ...................................... 365/191; 365/189.06

(58) Field of Search ............................ 365/191, 189.06, 365/189.07, 189.01

(56) References Cited

U.S. PATENT DOCUMENTS

| | | | |
|---|---|---|---|
| 5,572,474 | * 11/1996 | Sheen et al. | 365/207 |
| 5,642,313 | * 6/1997 | Ferris | 365/185.25 |
| 5,796,671 | * 8/1998 | Wahlstrom | 365/230.03 |

FOREIGN PATENT DOCUMENTS

| | | |
|---|---|---|
| 6-152377 | 5/1994 | (JP) . |
| 8-107346 | 4/1996 | (JP) . |

* cited by examiner

*Primary Examiner*—Hoai V. Ho
(74) *Attorney, Agent, or Firm*—McDermott, Will & Emery

(57) ABSTRACT

In an input/output circuit, a clamping circuit receives internal RAS signal at its gate and clamping circuit receives internal RAS signal at its gate. In an input/output circuit, an output buffer outputs a signal of a level ranging from a second supply potential to a first supply potential. The potential level of a multiplex-signal line varies with a small change of the amplitude according to the internal RAS even in the period in which "H" level is output as an external signal CKE. Then, the input/output circuit can receive this potential difference as the internal RAS level.

5 Claims, 8 Drawing Sheets

SEMICONDUCTOR DEVICE CAPABLE OF IMPLEMENTING SIMULTANEOUS SIGNAL INPUT AND OUTPUT FROM AND TO THE SAME EXTERNAL TERMINAL

BACKGROUND OF THE INVENTION

1. Field of the Invention

The present invention relates to a structure of an input/output circuit for transmitting and receiving a signal between semiconductor devices.

2. Description of the Background Art

FIG. 5 is a block diagram showing a portion related to an input/output circuit of a conventional semiconductor device.

FIG. 5 illustrates as one example a circuit structure for exchanging data between a semiconductor memory device 2000 and a memory control device 2100.

Semiconductor memory device 2000 includes an input circuit 1 for receiving an externally supplied control signal, a control circuit 5 for controlling an operation of semiconductor memory device 2000 according to a control signal supplied from input circuit 1, a memory array 7 for storing externally supplied data, and an input/output circuit 3 for transmitting and receiving data to and from the outside of semiconductor memory device 2000.

Memory control device 2100 includes an output circuit 2 for outputting a control signal, a control circuit 6 for generating a control signal, and an input/output circuit 4 for transmitting and receiving data to and from semiconductor memory device 2000.

Output circuit 2 of memory control device 2100 supplies to input circuit 1 of semiconductor memory device 2000 control signals such as chip select signal CS, row address strobe signal RAS, column address strobe signal CAS, write enable signal WE, address signal Address and clock enable signal CKE.

Input data Din supplied from memory control device 2100 to semiconductor memory device 2000 as well as output data Dout from semiconductor memory device 2000 are applied to a data signal line.

FIG. 6 is a timing chart illustrating operations of conventional semiconductor memory device 2000 and memory control device 2100 shown in FIG. 5.

Referring to FIG. 6, at time t1, "001" is supplied as a row address from memory control device 2100 to semiconductor memory device 2000 and signal ACT is activated ("L" level). Then, internal RAS signal operates to cause activation of a select line (word line) corresponding to an internal row "001" in memory array 7. At time t2, data is written into a column address, "100." When this writing operation is performed, data from a terminal Din of memory control device 2100 (memory tester, for example) is output to the data signal line to be supplied to semiconductor memory device 2000.

After this, an instruction for reading from the same address is issued at time t3, and data is read from semiconductor memory device 2000 at time t4. When this reading operation is performed, data Dout from semiconductor memory device 2000 is output to the data signal line.

Further, precharge operation is done at time t5 and then a self refresh mode starts at time t6 in which an internal row address (internal Row) "010" indicated by an internal counter is refreshed.

FIG. 7 is a block diagram illustrating a structure of input/output circuits 3 and 4 shown in FIG. 5.

Input/output circuit 3 includes an output buffer 30 operating between supply potential Vcc and ground potential Vss for supplying received signal Dout to a data input/output terminal and an input buffer 31 receiving supply potential Vcc and ground potential Vss to operate for receiving a signal from the input/output terminal and supplying the signal as internal data Din into semiconductor memory device 2000.

Input/output circuit 4 includes an output buffer 32 receiving supply potential Vcc and ground potential Vss to operate for receiving data Din generated from control circuit 6 and supplying the data to semiconductor memory device 2000 via a data input/output terminal and a data signal line and an input buffer 33 receiving supply potential Vcc and ground potential Vss to operate for receiving a signal from the data input/output terminal and supplying the signal to control circuit 6.

Output buffers 30 and 32 and input buffers 31 and 33 illustrated in FIG. 7 are all inverter circuits.

FIG. 8 is a timing chart illustrating operations of input/output circuits 3 and 4 shown in FIG. 7.

Referring to FIG. 8, at time t0, output buffer 30 of input/output circuit 3 is in a high-impedance state and output buffer 32 of input/output circuit 4 outputs data of "H" level (supply potential Vcc level). In this case, the potential level of the data signal line is "H" level and the level of internal data Din supplied from input buffer 31 in input/output circuit 3 is "L" level which is an inverted version of the data signal line level.

At time t1, a signal of "L" level is supplied from output buffer 32 to the data signal line and this level is inverted by input buffer 31 to change the level of internal data Din to "H" level.

At time t2, output buffer 32 enters a high-impedance state while output buffer 30 stays in the high-impedance state. As long as the potential of the data signal line is kept at "L" level, internal data Din is maintained at "H" level.

At time t3, output buffer 32 still stays in the high-impedance state and output buffer 30 outputs "H" level. Then, the level of the data signal line attains "H" level and the level of internal data Din changes to "L" level.

At time t4, the output level of output buffer 30 changes to "L" level and accordingly the level of the data signal line and the level of internal data Din change to "L" and "H" levels respectively.

As understood from the above, when data is transmitted between input/output circuits 3 and 4, output buffer 30 should be maintained in the high-impedance state at least during the period in which data is output from output buffer 32, while output buffer 32 should be maintained in the high-impedance state during the period in which data is output from output buffer 30.

In other words, it is impossible to simultaneously output data from output buffer 30 and output buffer 32 onto the data signal line.

According to the method of operation described above, data cannot be input to semiconductor memory device 2000 during the period in which semiconductor memory device 2000 outputs data.

Further, after a self refresh mode starts, internal RAS which is automatically generated within the semiconductor memory device operates asynchronously relative to an external signal. A select line (word line) to be activated is determined by an address indicated by an internal counter.

Therefore, conventional semiconductor memory device 2000 does not have means for monitoring from the outside a signal which is generated within the device.

A problem further arises that any abnormal state of an internal signal such as an abnormally prolonged cycle of self refresh is difficult to detect.

SUMMARY OF THE INVENTION

One object of the present invention is to provide a semiconductor device to and from which data can be input and output simultaneously from and to the same terminal.

In order to achieve this object, a semiconductor device according to one aspect of the present invention includes therein, for the purpose of allowing signals to be input and output simultaneously from and to the same terminal, a circuit for clamping the potential of an input signal which is supplied from the outside, and the level of clamping this input signal is controlled according to an internal signal. In this way, the level of the internal signal can be output to the outside by using variation of the clamping level of the input signal potential.

Specifically, the present invention is a semiconductor device including an internal circuit and an input/output circuit.

The internal circuit operates according to a signal supplied from the outside of the semiconductor device, and generates an internal signal having a first logic value and a second logic value. The input/output circuit transmits a signal between the internal circuit and the outside of the semiconductor device. The input/output circuit includes a signal terminal, a first input circuit, a first potential control circuit and a second potential control circuit.

The signal terminal receives an input signal and supplies it to an input node, the input signal capable of changing between a first potential level corresponding to the first logic value and a second potential level corresponding to the second logic value.

The first input circuit determines the potential level of the input signal supplied to the input node based on a predetermined threshold level, and supplies a signal having either one of the potential level corresponding to the first logic value and the potential level corresponding to the second logic value.

The first potential control circuit increases the potential level of the input node by a first voltage in response to a transition of the internal signal from the first logic level to the second logic level. The first voltage is smaller than a potential difference between the first potential level and the threshold level.

The second potential control circuit decreases the potential level of the input node by a second voltage in response to a transition of the internal signal from the second logic level to the first logic level. The second voltage is smaller than a potential difference between the second potential level and the threshold level.

According to another aspect of the invention, a semiconductor device includes a first output circuit, a signal terminal and a second input circuit.

The first output circuit outputs, according to an internal signal having any of a first logic value and a second logic value, a signal which can change between a first potential level corresponding to the first logic value and a second potential level corresponding to the second logic value. The signal terminal receives the signal from the first output circuit.

The second input circuit detects, based on a first threshold between the first potential level and a third potential level and based on a second threshold between a fourth potential level and the second potential level, that a signal corresponding to the first logic value is supplied to the signal terminal if a potential level on the signal terminal is between the first potential level and the first threshold and if the potential level is between the fourth potential level and the second threshold, and detects that a signal corresponding to the second logic value is supplied to the signal terminal if the potential level on the signal terminal is between the first threshold and the third potential level and if the potential level is between the second threshold and the fourth potential level. Here, the third potential level is greater than the first potential level by a first predetermined potential and the fourth potential level is smaller than the second potential level by a second predetermined potential level.

Accordingly, a principal advantage of the present invention is that a clamping level of a potential level on the signal terminal can be changed according to an internal signal so that data can be output based on a small change of the amplitude of the clamping level simultaneously with data input.

Another advantage of the present invention is that a signal having a level with a changeable clamping level can be output and simultaneously a small amplitude change of the clamping level can be detected, so that simultaneous data output and data input is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
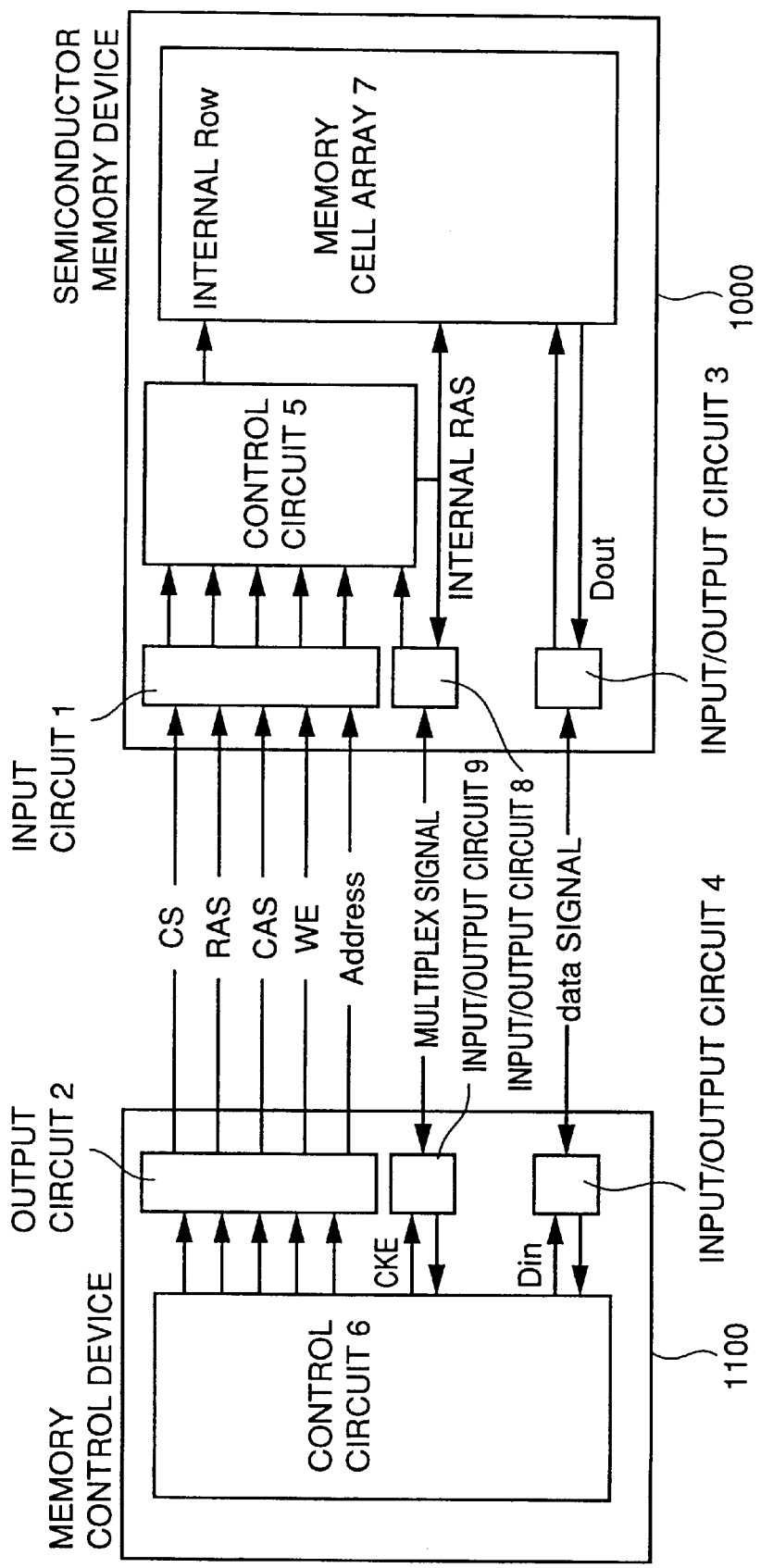
FIG. 1 is a block diagram illustrating a structure of a semiconductor memory device 1000 and a memory control device 1100 according to an embodiment of the present invention.

FIG. 1 is a block diagram illustrating a structure of a semiconductor device according to one embodiment of the present invention.

FIG. 1 illustrates a structure as one example for exchanging data between a semiconductor memory device 1000 and a memory control device 1100.

Semiconductor memory device 1000 includes an input circuit 1 for receiving a control signal from the outside, a control circuit 5 for controlling an operation of semiconductor memory device 1000 according to a control signal from the outside, a memory array 7 controlled by control circuit 5 to hold storage data, an input/output circuit 3 controlled by control circuit 5 to transmit storage data between the outside of semiconductor memory device 1000 and memory array 7, and an input/output circuit 8 for receiving a control signal supplied from control circuit 5, for example, internal RAS to output it to the outside and receiving externally supplied clock enable signal CKE.

Memory control device 1100 includes an output circuit 2 for outputting a control signal to semiconductor memory device 1000, a control circuit 6 for generating a control signal to be supplied to output circuit 2, an input/output circuit 4 for transmitting data between semiconductor memory device 1000 and control circuit 6, and an input/output circuit 9 capable of supplying signal CKE to semiconductor memory device 1000 and simultaneously receiving a signal corresponding to internal RAS supplied from input/output circuit 8 of semiconductor memory device 1000.

Output circuit 2 in memory control device 1100 supplies control signals to input circuit 1 in semiconductor memory device 1000 such as chip select signal CS, row address strobe signal RAS, column address signal CAS, write enable signal WE and address signal Address.

Input/output circuit 9 of memory control device 1100 supplies clock enable signal CKE and input/output circuit 8 of semiconductor memory device 1000 supplies internal RAS signal onto a multiplex-signal line. Input/output circuit 8 receives signal CKE from input/output circuit 9 and input/output circuit 9 receives a signal corresponding to internal RAS signal from input/output circuit 8.

In other words, this structure enables signals to be input and output at the same time between input/output circuits 9 and 8 as described below.

Memory control device 1100 supplies data Din onto a data signal line and semiconductor memory device 1000 outputs data Dout.

Figure 2:
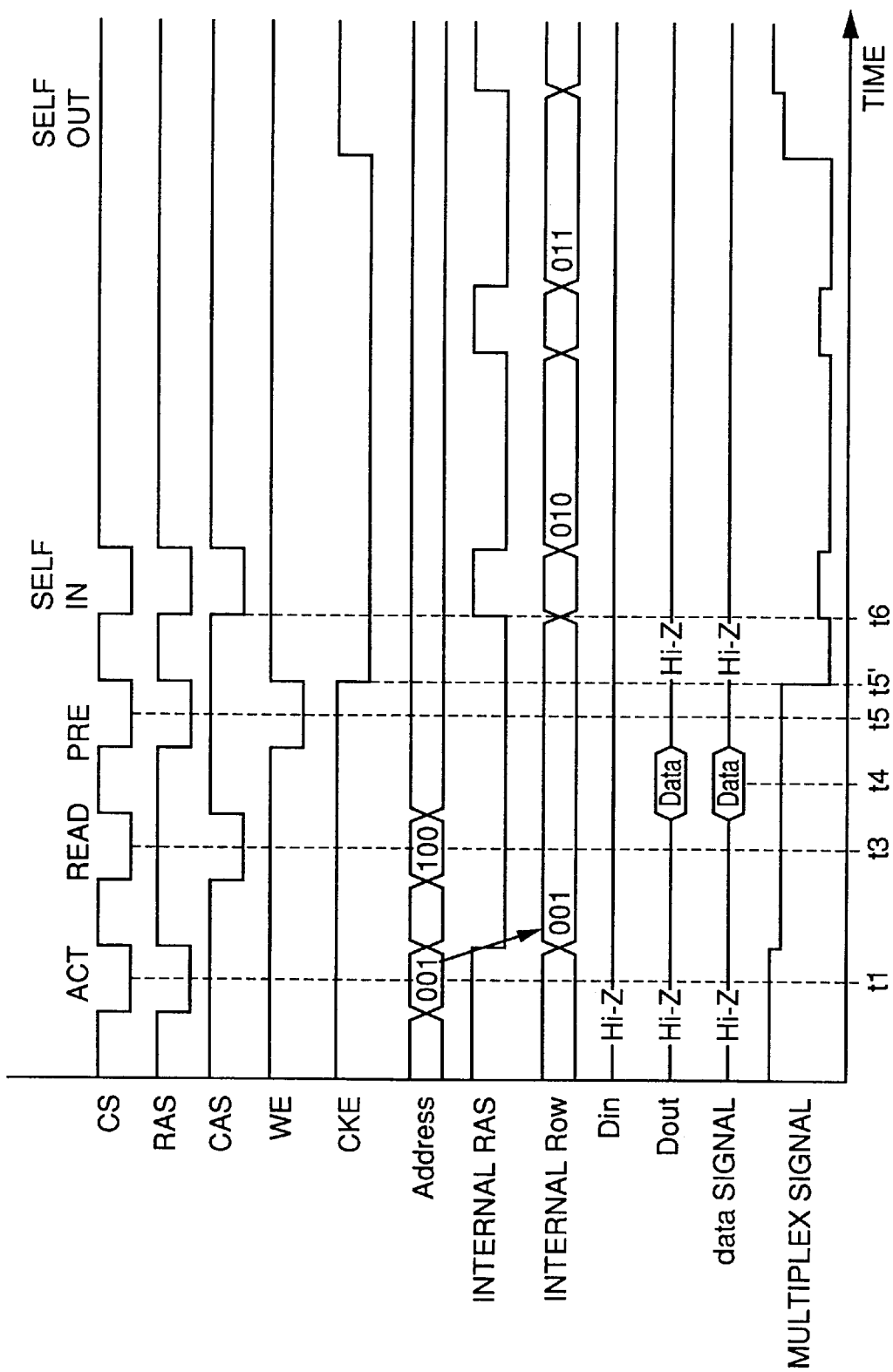
FIG. 2 is a timing chart illustrating operations of semiconductor memory device 1000 and memory control device 1100 shown in FIG. 1.

FIG. 2 is a timing chart illustrating operations of semiconductor memory device 1000 and memory control device 1100.

Figure 6:
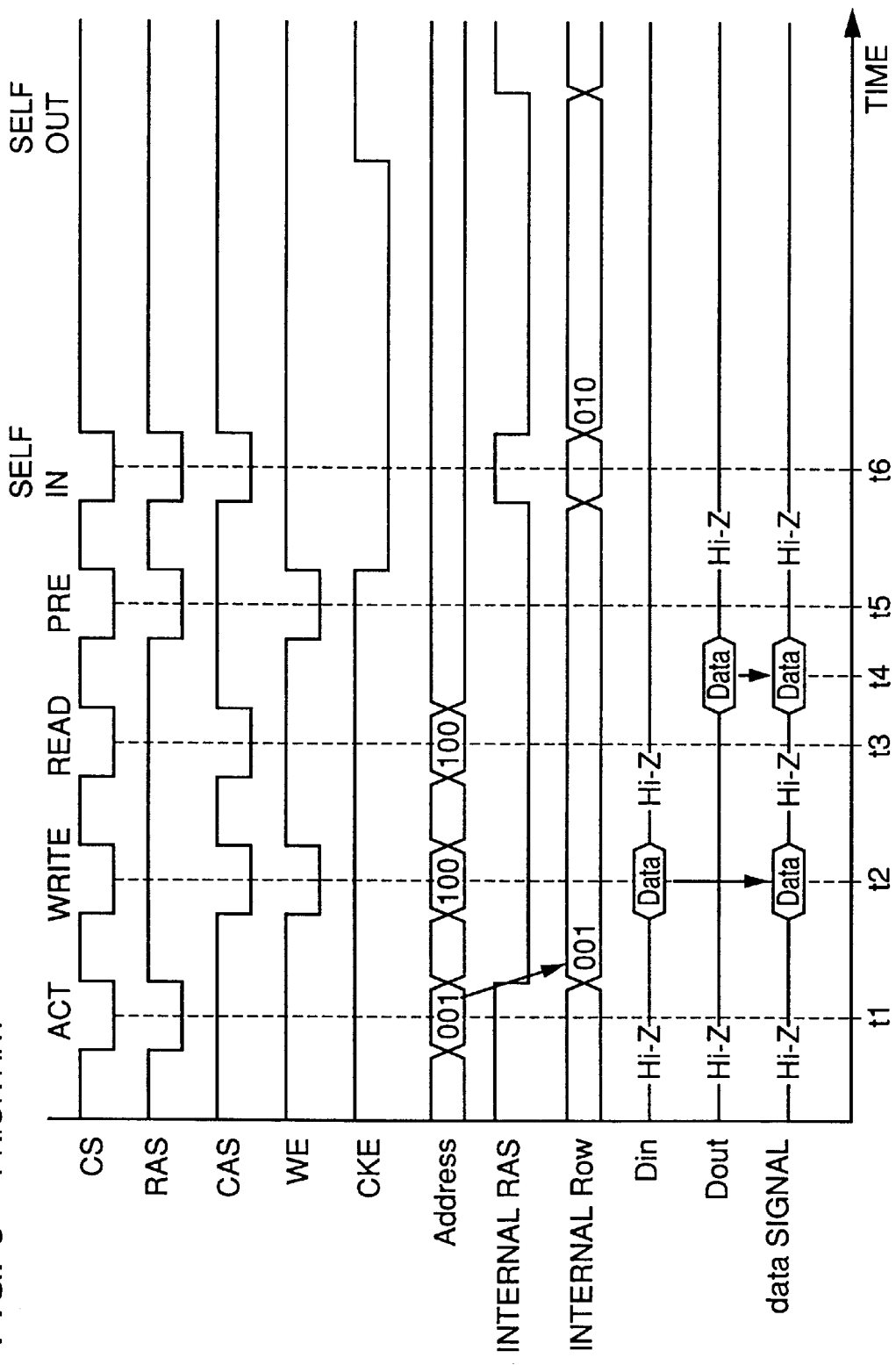
FIG. 6 is a timing chart illustrating operations of conventional semiconductor memory device 2000 and memory control device 2100 shown in FIG. 5.
Figure 7:
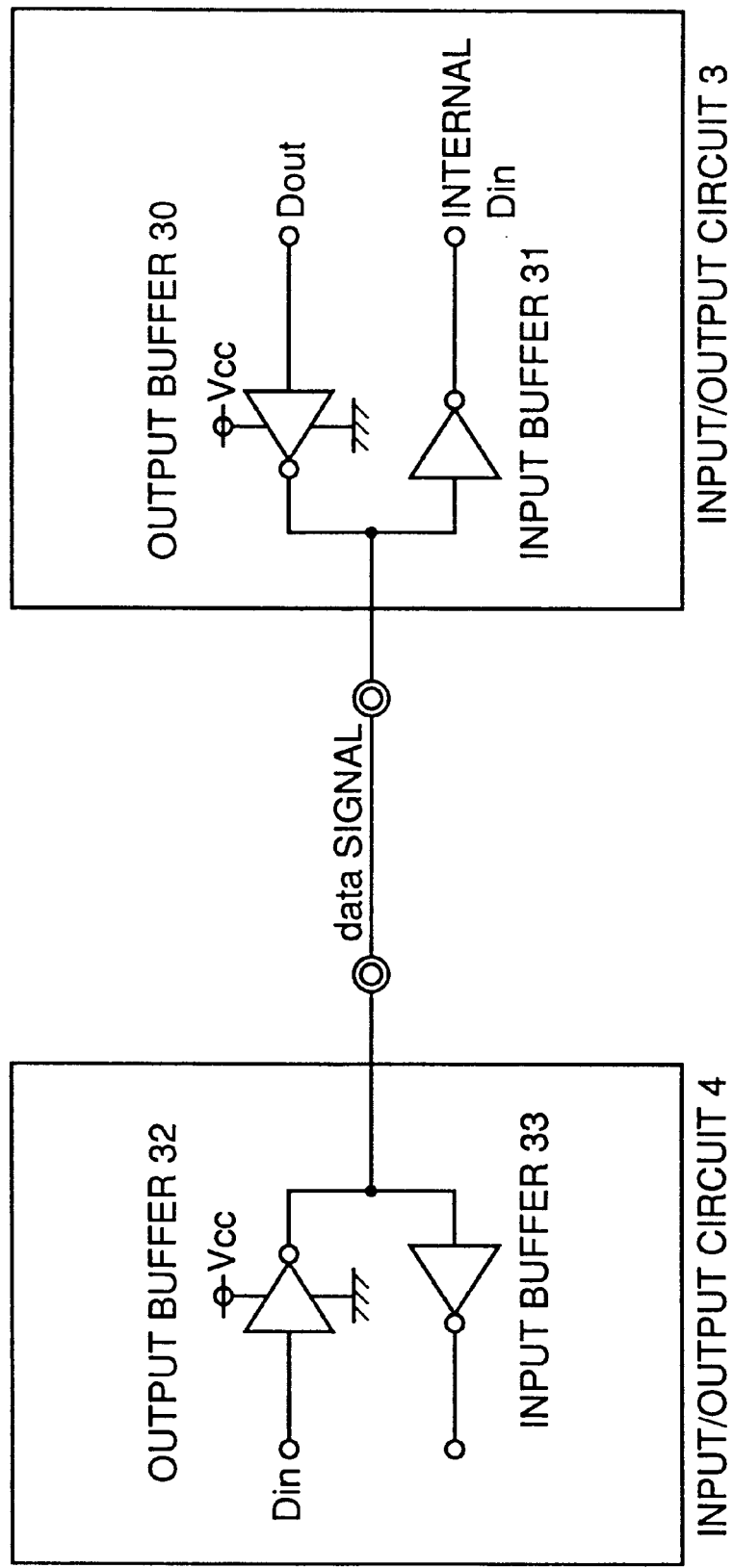
FIG. 7 is a block diagram illustrating a structure of input/output circuits 3 and 4 shown in FIG. 5.
Figure 8:
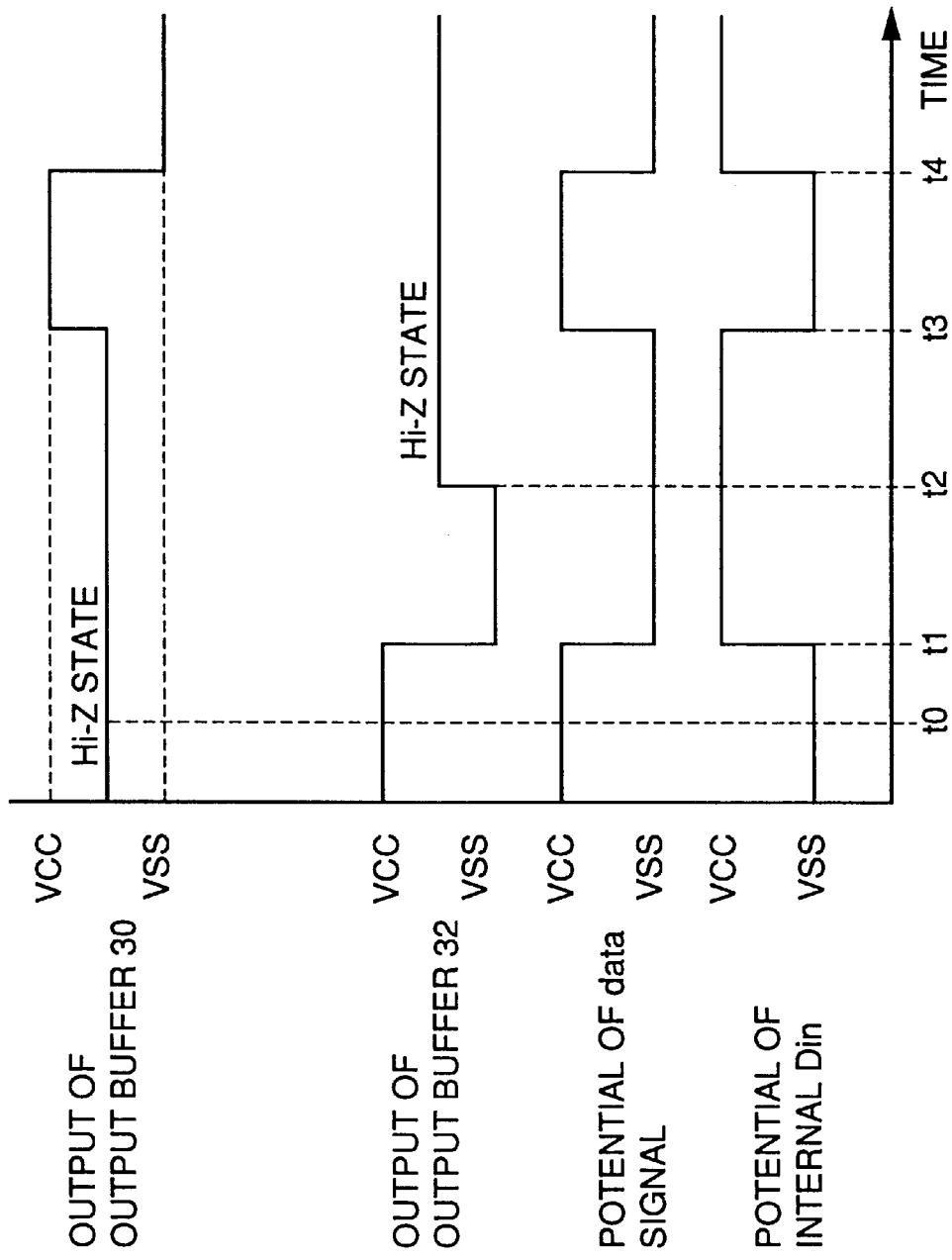
FIG. 8 is a timing chart illustrating operations of input/output circuits 3 and 4 shown in FIG. 7.

The operation from time t1 to time t5 is basically identical to the corresponding operation shown in FIG. 6, and the same reference character as that in FIG. 6 is used for representing an operation at any time in FIG. 2 identical to that in FIG. 6.

In a self refresh operation starting at time t6, internal RAS signal which is automatically generated by control circuit 5 in semiconductor memory device 1000 operates asynchronously relative to the outside. In order to monitor this signal from the outside, an operation as discussed below is performed in the structure shown in FIG. 1.

Specifically, if memory control device 1100 outputs "0" as signal CKE, input/output circuit 9 transmits the level "0" of signal CKE to the multiplex-signal line at time t5', for example.

At this time, the waveform remarkably changes from "H" level to "L" level. After this, at time t6, signals RAS and CAS at level "0" are input to start a self refresh mode.

Internal RAS signal is supplied to input/output circuit 8 and superimposed on signal CKE. The change of waveform caused by internal RAS exhibits a small change of amplitude as shown in FIG. 2. Input/output circuit 9 amplifies the small amplitude change to detect a change of potential in semiconductor memory device 1000.

Figure 3:
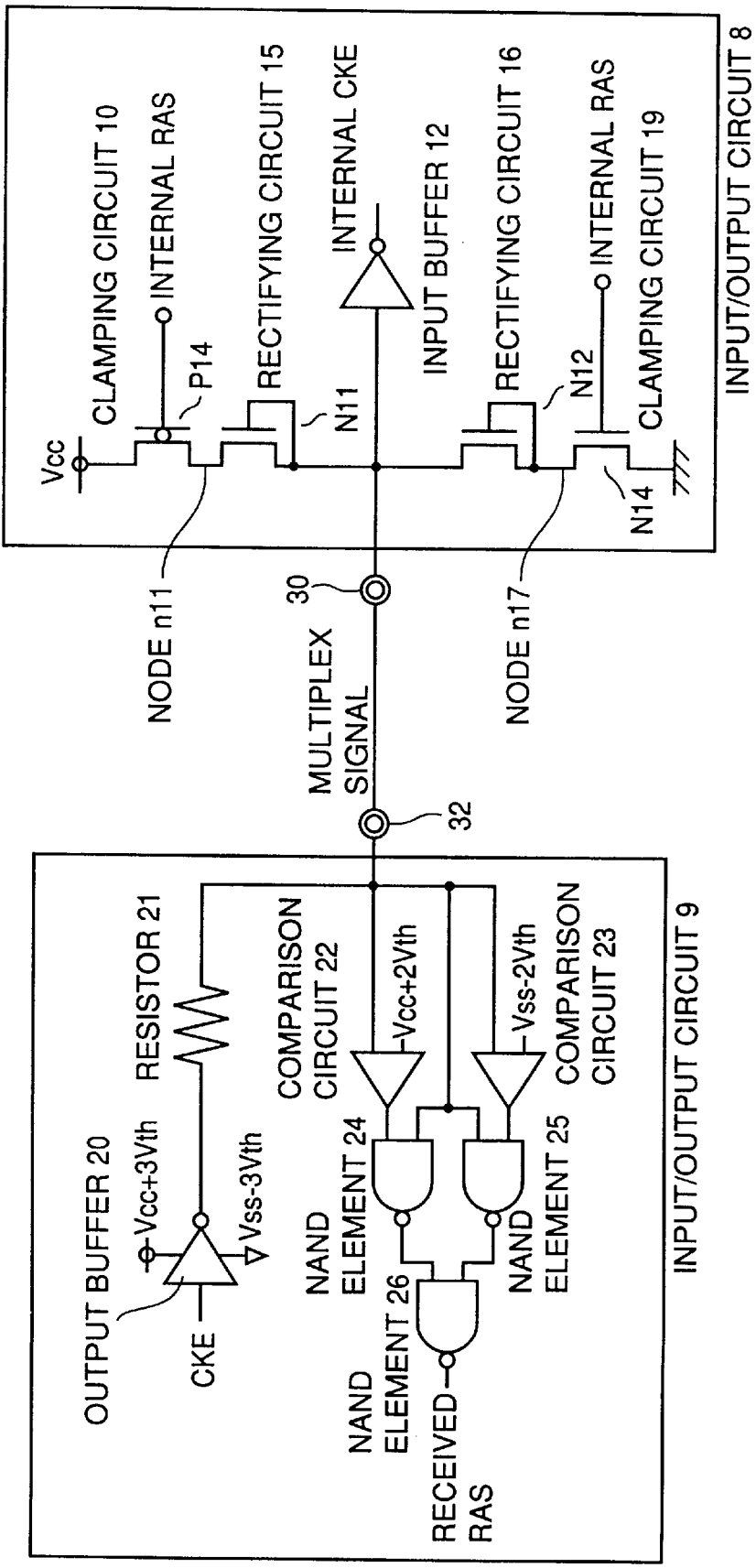
FIG. 3 is a circuit diagram illustrating a structure of input/output circuits 8 and 9 shown in FIG. 1.

FIG. 3 is a circuit diagram illustrating in detail a structure of input/output circuits 8 and 9 shown in FIG. 1.

Input/output circuit 8 includes a clamping circuit 10 having one end connected to power supply Vcc and controlled by internal RAS, a clamping circuit 19 having one end connected to ground potential Vss and controlled by internal RAS, a rectifying circuit 15 connected between an input/output terminal 30 and clamping circuit 10, a rectifying circuit 16 connected between input/output terminal 30 and clamping circuit 19, and an input buffer 12 receiving a signal as an input from input/output terminal 30 to output internal CKE signal to the inside of semiconductor memory device 1000. The other end of clamping circuit 10 is referred to as a node n11 and the other end of clamping circuit 19 is referred to as a node n17.

Rectifying circuits 15 and 16 include diode-connected N channel MOS transistors N11 and N12 respectively, clamping circuit 10 includes a P channel MOS transistor P14 receiving internal RAS signal at its gate, and clamping circuit 19 includes an N channel MOS transistor N14 receiving internal RAS signal at its gate.

Input/output circuit 9 includes an output buffer 20 receiving signal CKE as input, receiving power supply level Vcc+3Vth and power supply level Vss−3Vth to operate, and having an output potential of a width ranging from the level Vcc+3Vth to the level Vss−3Vth, a resistor element 21 provided between output buffer 20 and an input/output terminal 32, a comparison circuit 22 having an input node coupled to input/output terminal 32 and using a signal level Vcc+2Vth as a reference potential, a comparison circuit 23 having an input node coupled to input/output terminal 32 and using a signal level Vss−2Vth as a reference potential, a NAND circuit 24 receiving an output from comparison circuit 22 and a signal from input/output terminal 32 as inputs, a NAND circuit 25 receiving as inputs an output from comparison circuit 23 and an inverted version of a signal from input/output terminal 32, and a NAND circuit 26 receiving outputs from respective NAND circuits 24 and 25 as inputs.

Here, the reference Vth represents a threshold of an N channel MOS transistor employed in circuits which constitute input/output circuits 9 and 8.

Figure 4:
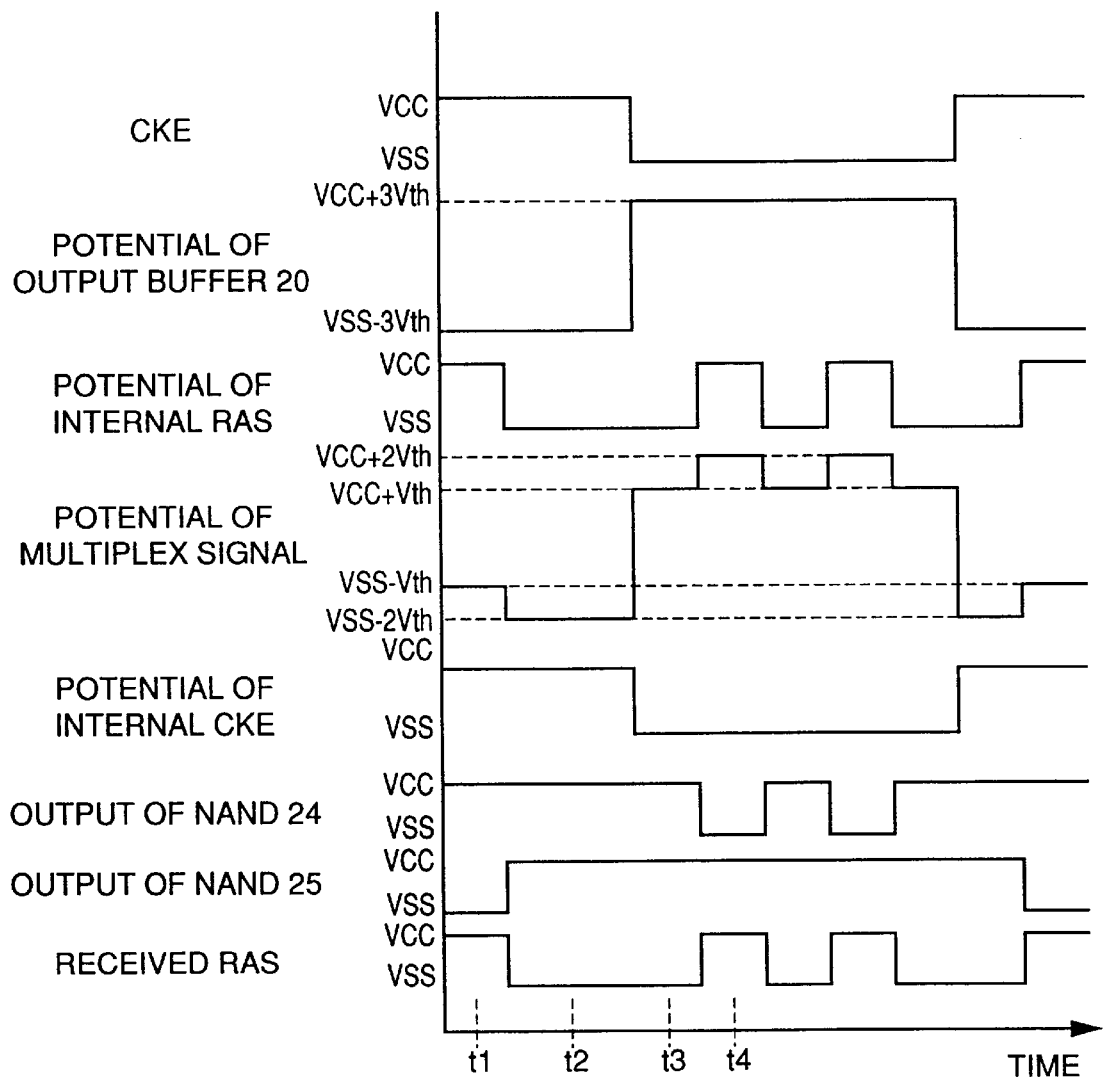
FIG. 4 is a timing chart illustrating operations of input/output circuits 8 and 9.
Figure 5:
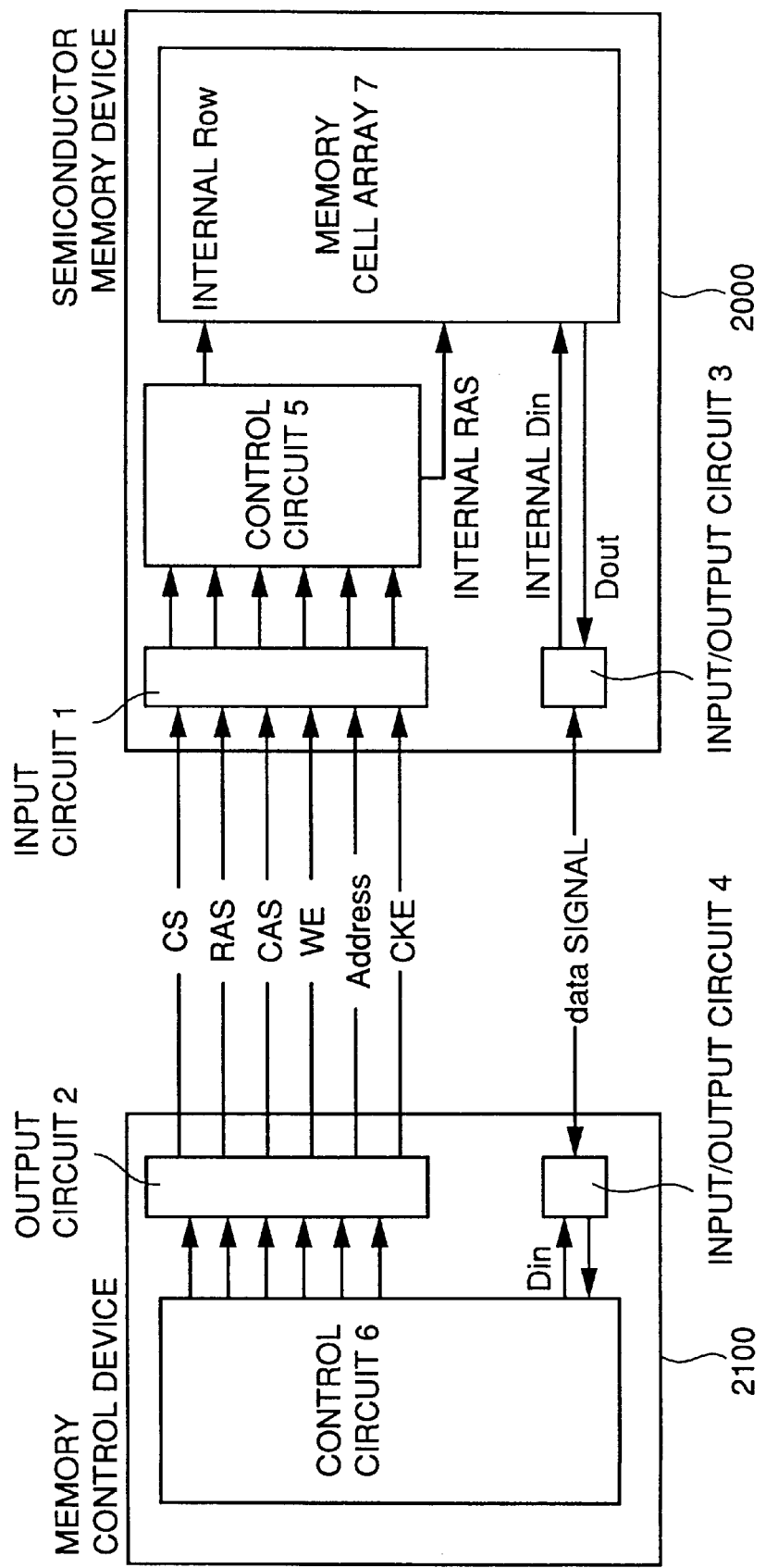
FIG. 5 is a block diagram illustrating a structure of a conventional semiconductor memory device 2000 and a conventional memory control device 2100.

FIG. 4 is a timing chart illustrating operations of input/output circuits 8 and 9 shown in FIG. 3.

Referring to FIG. 4, description is first given regarding operations of input/output circuits 8 and 9 at time t1 at which signal CKE is at "H" level and internal RAS is at "H" level.

At this time, output buffer 20 outputs the level Vss−3Vth. Since internal RAS supplied to clamping circuit 19 is at "H" level, clamping circuit 19 is in ON state while node n17 has ground potential Vss. Because of the presence of rectifying circuit 16, the potential on input/output terminal 30 is fixed at potential Vss−Vth.

Input buffer 12 makes determination based on the CMOS level and outputs "L" level as internal CKE.

The current flowing through resistor 21 is the one determined by a potential difference between a potential on input/output terminal 32 and an output potential of output buffer 20 as well as a resistance value of resistor 21. The resistance value of resistor 21 is determined so as not to allow the resistance value to exceed an allowable amount of clamping circuit 19.

The potential on input/output terminal 32 has the level Vss−Vth, so that an output from comparison circuit 22 is at "L" level while an output from comparison circuit 23 is at "H" level.

Since NAND circuit 24 receives as an input a signal from input/output terminal 32, NAND circuit 24 outputs "H" level.

NAND circuit 25 receives as an input an inverted version of a signal from input/output terminal 32 and accordingly outputs "L" level.

NAND circuit 26 thus outputs "H" level, which corresponds to the fact that internal RAS of semiconductor memory device 1000 is at "H" level.

Description is next presented regarding an operation performed when signal CKE and signal RAS are "H" and "L" levels respectively at time t2.

In this case, internal RAS signal is at "L" level (Vss) and thus clamping circuit 19 is in OFF state. Accordingly, node n17 is fixed at potential level Vss−Vth and the multiplex-signal line is fixed at potential level Vss−2Vth.

At this time, both of comparison circuits 22 and 23 have the output level "L," so that signal RAS received by input/output circuit 9 is at "L" level.

On the other hand, internal CKE of input/output circuit 8 can retain "H" level.

An operation is described below which is performed when signal CKE and internal RAS are at "L" level at time t3. In this case, clamping circuit 10 is conducting and thus the potential level of node n11 is Vcc.

Because of the voltage drop in rectifying circuit 15, input/output terminal 30 has potential level Vcc+Vth.

In this case, internal CKE holds "L" level. On the other hand, comparison circuit 22 outputs "L" level and comparison circuit 23 outputs "H" level. The potential level of the input/output terminal is higher than Vcc and accordingly NAND circuit 25 outputs "H" level. Then, "L" revel is output as a level of internal RAS to be received.

If signal CKE is at "L" level and internal RAS is at "H" level (Vcc) at time t4, clamping circuit 10 enters OFF state. Therefore, the potential level of node n11 is fixed at Vcc+Vth.

The potential level of input/output terminal 30 is higher than that potential level of node n11 by 1×Vth. Therefore, the potential level of input/output terminal 30 is fixed at Vcc+2Vth.

Internal CKE is accordingly kept at "L" level.

Both of the comparison circuits 22 and 23 output "H" level. Accordingly, the output level of NAND circuit 24 is "L" level and thus "H" level is obtained as received RAS.

As heretofore described, according to the present invention, a signal within a semiconductor device can be supplied to the outside without interfering with an input from the outside. There is no need for a special input/output terminal. This system is based on variation of the clamping level, which generally increases power consumption when bidirectional input/output is made. However, if the drive operation is performed by control device 1100 which has output levels Vcc and Vss identical to those used by semiconductor memory device 1000, no extra power consumption occurs.

The description above has been given regarding the structure in which a signal within semiconductor memory device 1000 which is not usually output to the outside is monitored from the outside, via a terminal 30 which is only used as an input terminal by the system. However, in general, the present invention is applicable not only to such an input-dedicated terminal but to an ordinary input/output terminal.

In addition, the description above has been made concerning a structure constituted of semiconductor memory device 1000 and memory control device 1100 therefor. However, the present invention is applicable to an input/output circuit implementing more generally employed signal transmission between semiconductor devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an internal circuit operating according to a signal supplied from the outside of said semiconductor device and generating an internal signal having a first logic value and a second logic value; and
   an input/output circuit for transmitting a signal between said internal circuit and the outside of said semiconductor device,
   said input/output circuit including:
   a signal terminal receiving an input signal and supplying the input signal to an input node, said input signal capable of changing between a first potential level corresponding to said first logic value and a second potential level corresponding to said second logic value;
   a first input circuit determining a potential level of said input signal supplied to said input node based on a predetermined threshold level and supplying to said internal circuit a signal having either one of a potential level corresponding to said first logic value and a potential level corresponding to said second logic value;
   a first potential control circuit increasing the potential level of said input node by a first voltage in response to a transition of said internal signal from said first logic level to said second logic level, said first voltage being smaller than a potential difference between said first potential level and said threshold level; and
   a second potential control circuit decreasing the potential level of said input node by a second voltage in response to a transition of said internal signal from said second logic level to said first logic level, said second voltage being smaller than a potential difference between said second potential level and said threshold level.

2. The semiconductor device according to claim 1, wherein said first potential control circuit includes:
   a first switch circuit coupled between a first internal node and a first supply potential higher than said first potential level and lower than said threshold level, and entering any of a conducting state or a cutoff state according to said internal signal; and
   a first rectifying circuit coupled between said first internal node and said input node and having a forward direction from said first internal node toward said input node, and
   said second potential control circuit includes:
   a second switch circuit coupled between a second internal node and a second supply potential lower than said second potential level and higher than said threshold level and entering any of a conducting state and a cutoff state complimentarily to said first switch circuit; and
   a second rectifying circuit coupled between said second internal node and said input node and having a forward direction from said input node toward said second internal node.

3. The semiconductor device according to claim 2, wherein said second switch circuit includes a first P channel MOS transistor receiving said internal signal at its gate, and said first switch circuit includes a second N channel MOS transistor receiving said internal signal at its gate.

4. The semiconductor device according to claim 3, wherein said first rectifying circuit includes a diode-connected third N channel MOS transistor, and said second rectifying circuit includes a diode-connected fourth N channel MOS transistor.

5. The semiconductor device according to claim 4, wherein said first potential level is lower than said first supply potential at least by a sum of a threshold of said second N channel MOS transistor and a threshold of said third N channel MOS transistor, and said second potential level is higher than said second supply potential at least by a sum of a threshold of said first P channel MOS transistor and a threshold of said fourth N channel MOS transistor.

* * * * *